United States Patent [19]
Fujioka

[11] Patent Number: 5,300,446
[45] Date of Patent: Apr. 5, 1994

[54] METHOD OF MAKING STAGGERED GATE MOSTFT

[75] Inventor: Toshio Fujioka, Hamamatsu, Japan

[73] Assignee: Yamaha Corporation, Hamamatsu, Japan

[21] Appl. No.: 57,747

[22] Filed: May 5, 1993

[30] Foreign Application Priority Data

May 8, 1992 [JP] Japan .................. 4-143306

[51] Int. Cl.⁵ .......................... H01L 21/265
[52] U.S. Cl. ..................... 437/41; 437/913; 437/915; 148/DIG. 105; 148/DIG. 106; 148/DIG. 150
[58] Field of Search ............ 437/41, 44, 40, 913, 437/915, 208, 56, 58; 148/DIG. 105, DIG. 106

[56] References Cited

U.S. PATENT DOCUMENTS

| | | | |
|---|---|---|---|
| 4,372,033 | 2/1983 | Chiao | 437/36 |
| 4,603,468 | 8/1986 | Lam | 437/915 |
| 4,628,589 | 12/1986 | Sundaresan | 437/915 |
| 4,651,408 | 3/1987 | MacElwee et al. | 437/915 |
| 4,656,731 | 4/1987 | Lam et al. | 437/915 |
| 5,153,145 | 10/1992 | Lee et al. | 437/44 |
| 5,158,898 | 10/1992 | Hayden et al. | |

FOREIGN PATENT DOCUMENTS

| | | | |
|---|---|---|---|
| 60-77460 | 5/1985 | Japan | 437/36 |
| 63-44768 | 2/1988 | Japan | 437/40 |
| 2-277246 | 11/1990 | Japan | 437/915 |

*Primary Examiner*—Brian E. Hearn
*Assistant Examiner*—Michael Trinh
*Attorney, Agent, or Firm*—Spensley Horn Jubas & Lubitz

[57] ABSTRACT

On an insulating film (12) covering the surface of a semiconductor substrate (10), a gate electrode layer (14), a gate insulating film (16), and a semiconductor layer (18) such as silicon are sequentially deposited to form an under-gated MOS transistor. A flat coating film such as resist is formed covering the semiconductor layer (18). The coating film is then etched back to expose the surface of the semiconductor layer (18) at the area above the gate electrode layer (14). The left coating film is used as the mask for the selective growth of a mask material layer (24) such as tungsten on the exposed surface of the semiconductor layer (18) with a side-projection. After removing the left coating film, impurity ions such as BF2 are selectively injected in the semiconductor layer (18) using the mask material layer (24) as the mask to form a source region (18S) and a drain region (18D).

6 Claims, 3 Drawing Sheets

METHOD OF MAKING STAGGERED GATE MOSTFT

BACKGROUND OF THE INVENTION a) Field of the Invention

The present invention relates to a method of manufacturing a semiconductor device, and more particularly to a method of manufacturing a lower gate (so-called staggered gate or under-gated)type MOS thin film transistor having a gate electrode under the channel region.

b) Description of the Related Art

A conventional method of manufacturing a lower gate type MOS thin film transistor is known as illustrated in FIG. 8. With this method, on an insulating film 12 covering the surface of a semiconductor substrate 10, a gate electrode layer 14, a gate insulating layer 16, and a semiconductor layer 18 such as polycrystalline silicon are sequentially formed. Using a resist layer 20 as a mask, impurity ions such as BF2 are injected selectively in the semiconductor layer 18 to form a source region 18S and a drain region 18D.

For such a thin film transistor, it is important to precisely control the offset amount S of the drain region 18D from the gate electrode layer 14. If the offset amount S is small (or no offset), an off-current (leakage current) becomes great, whereas if the offset amount S is large, an on-current becomes less (or no on-current). The offset amount S is generally set to a predetermined value within the range of about 0.3 to 0.6 $\mu$m.

With the conventional method, however, an alignment error in the order of 0.3 to 0.4 $\mu$m is likely to occur under the condition that the ion injection process for the source and drain regions is performed by using the resist layer 20 as the mask. Therefore, the drain and source regions are formed at many different positions in a single manufacturing lot. The difference of the position of a drain region changes the offset amount S and transistor characteristics.

SUMMARY OF THE INVENTION

It is an object of the present invention to provide a novel method of manufacturing a thin film transistor capable of reducing the variance of the positions of drain and source regions.

According to one aspect of the present invention, there is provided a method of manufacturing a semiconductor device comprising the steps of: forming a gate electrode layer on the insulating surface of a substrate; forming a gate insulating film covering the gate electrode layer; forming a semiconductor layer on the gate insulating film to ride on the gate electrode layer; forming a flat coating film covering the semiconductor layer; etching back the coating film to expose the surface of the semiconductor layer at the area riding on the gate electrode layer and to leave the coating film at both side areas of the exposed surface; selectively growing a mask material layer on the exposed surface of the semiconductor layer, by using the left coating film as a mask; and removing the left coating film and selectively injecting impurity ions in the semiconductor layer to form an impurity doped surface region and an impurity doped drain region at opposite sides of the gate electrode region, by using the mask material layer as an ion injection mask.

With this method, a selective ion injection process is performed by using as the ion injection mask the mask material layer selectively grown on the semiconductor layer above the gate electrode layer. The positions of the source and drain regions are therefore formed in self-alignment with the mask material layer. It is possible to greatly reduce the variance of the positions of source and drain regions by controlling the selective growth of the mask material layer with good reproducibility, thereby considerably improving the manufacturing yield of lower gate type MOS thin film transistors.

DETAILED DESCRIPTION OF THE PREFERRED EMBODIMENTS

Figure 1:
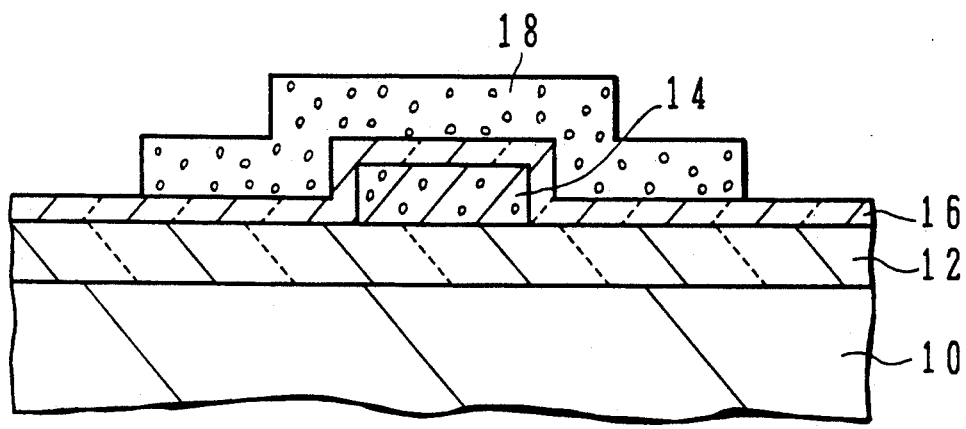
FIGS. 1 to 6 are cross sectional views of a semiconductor substrate explaining a method of manufacturing a thin film transistor according to an embodiment of the present invention.
Figure 2:
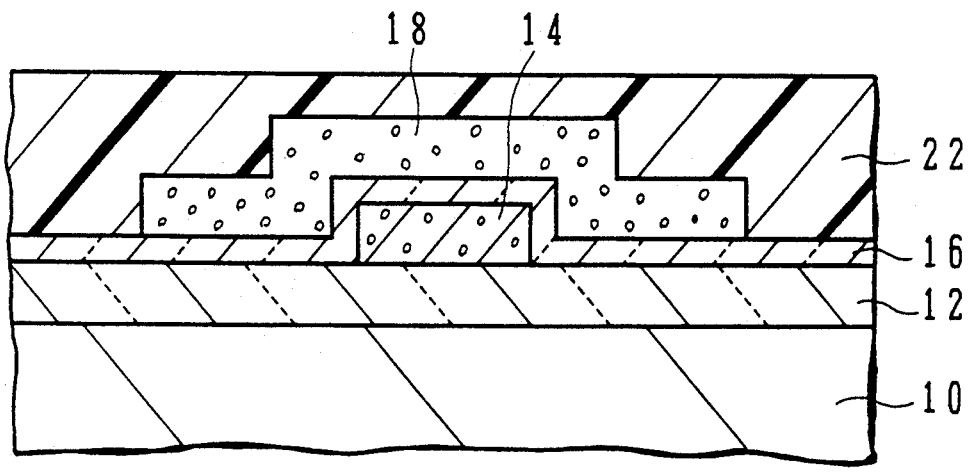
Figure 3:
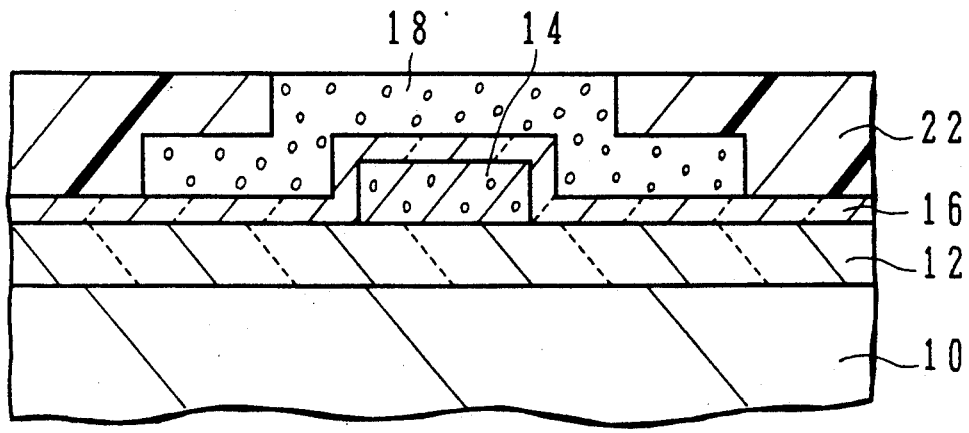

FIGS. 1 to 6 are cross sections explaining a method of manufacturing a lower gate type (under-gated) MOS thin film transistor according to an embodiment of the present invention. An under-gated transistor is a transistor that has a source, a drain, and a channel region that are formed overlaying a gate region. The processes (1) to (6) correspondingly illustrated in FIGS. 1 to 6 will be sequentially described in this order.

(1) On the surface of a semiconductor substrate 10 made of silicon for example, there are formed an integrated circuit such as memories. An insulating film 12 such as silicon oxide is formed covering the integrated circuit. A gate electrode layer 14 such as polycrystalline silicon containing n+-type impurities is formed on the insulating film 12. Thereafter, a gate insulating film 16 such as silicon oxide is formed covering the gate electrode layer 14, by means of chemical vapor deposition (CVD) or the like. A semiconductor layer 18 such as polycrystalline silicon is formed on the gate insulating film 16 by means of CVD or the like. The semiconductor layer 18 is shaped in a desired source-channel-drain pattern. This patterning may be performed after the process to be later described with FIG. 5 or 6.

(2) Next, a flat coating film 22 such as resist is formed covering the semiconductor layer 18 above the substrate. As the material of the coating film 22, spin-on-glass (SOG), polyimide resin, or the like may be used.

(3) The coating film 22 is then etched back until the surface of the semiconductor layer 18 at the area overlaying on the gate electrode layer 14 is partially exposed, while leaving the coating film 22 at both side areas of the exposed surface.

Figure 7:
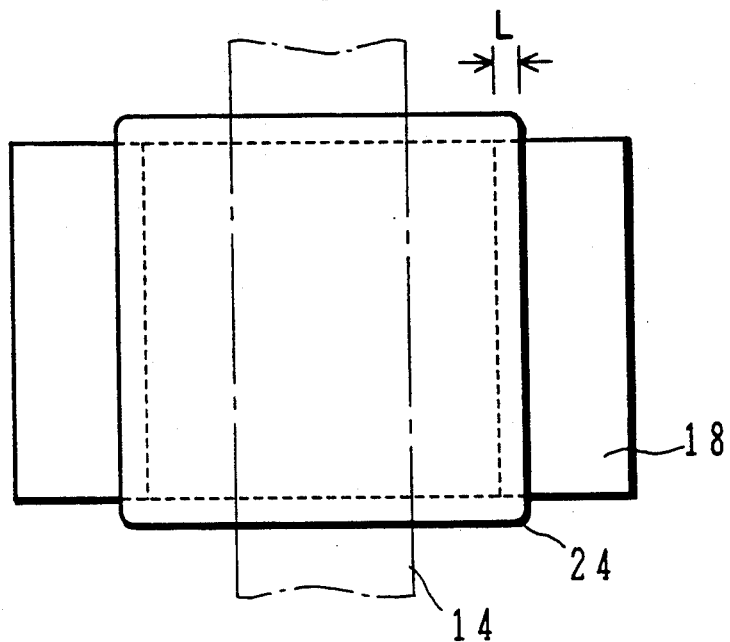
FIG. 7 is a top view showing the layout of the mask material layer shown in FIG. 4.
Figure 8:
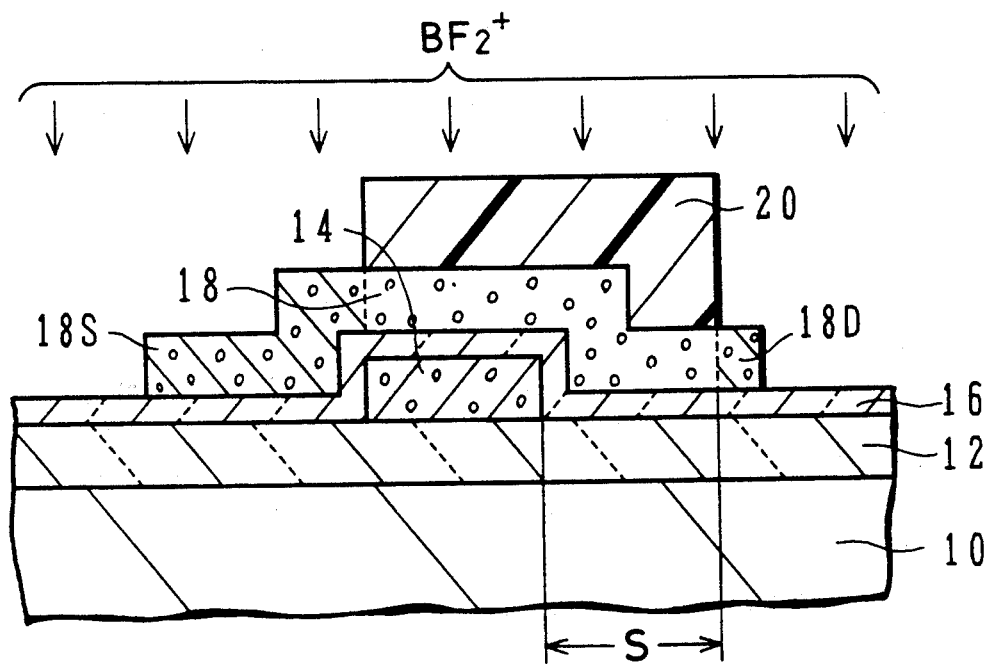
FIG. 8 is a cross sectional view of a semiconductor substrate explaining a conventional method of manufacturing a thin film transistor.

(4) Next, a mask material layer 24 such as W is formed on the exposed surface of the semiconductor layer 18 by selective CVD, the mask material layer having a pattern shown in the plan view of FIG. 7. As a result of the selective CVD, the mask material 24 overlaying the semiconductor layer 18 is grown with an excessive portion, i.e., a side projection having a length L. As the mask material layer 24, an Al layer may be grown.

The conditions of the selective growth of the W layer may be set as follows:

Back vacuum pressure: ca. $10^{-7}$ Torr

Ratio of silane gas (SiH$_4$) to tungsten hexafluoride gas (WF$_6$) during growth: typically 0.6, usually smaller than 1

Total pressure: 5 to 50 mTorr

Substrate temperature: 200° to 400° C.

(5) Next, the left coating film 22 is removed. If a resist layer is used as the coating film 22, the resist layer is stripped by using H$_2$SO$_4$/H$_2$O$_2$/H$_2$O. By using the mask material layer 24 as a mask, p$^+$-type impurity ions such as BF$_2$ are selectively injected in the semiconductor layer 18 to form a source region 18S and a drain region 18D at the opposite side areas of the gate electrode layer 14.

(6) The mask material layer 24 is then stripped. If a W layer is used as the mask material layer 24, the W layer is removed by using K$_3$[Fe(CN)$_6$]/KOH/H$_2$ or NH$_4$OH/H$_2$O$_2$/H$_2$O. If an Al layer is used as the mask material layer 24, Al is dissolved by using PNA(H$_3$PO$_4$/HNO$_3$/CH$_3$COOH/H$_2$O), and then the surface of the semiconductor layer 18 of polycrystalline silicon is slightly etched. Thereafter, an annealing process is performed to activate the p$^+$-type impurities in the source region 18S and drain region 18D.

Figure 4:
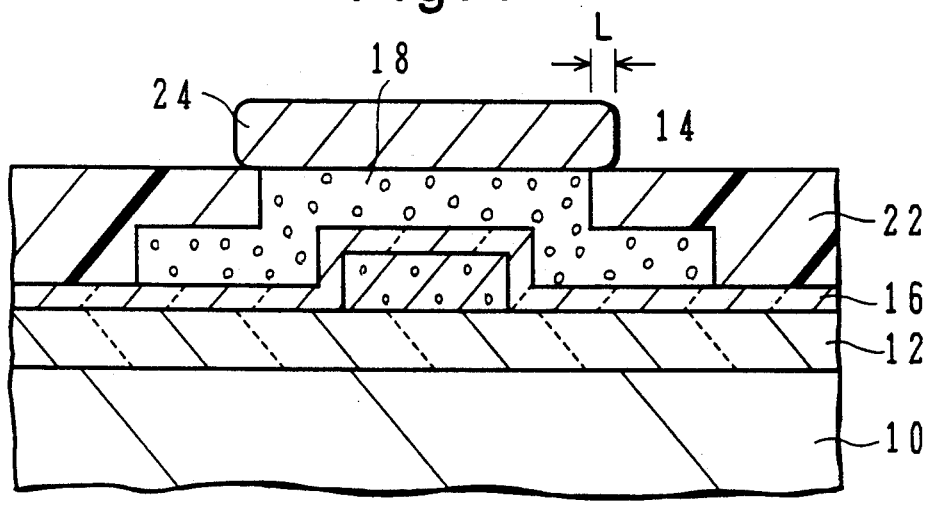
Figure 5:
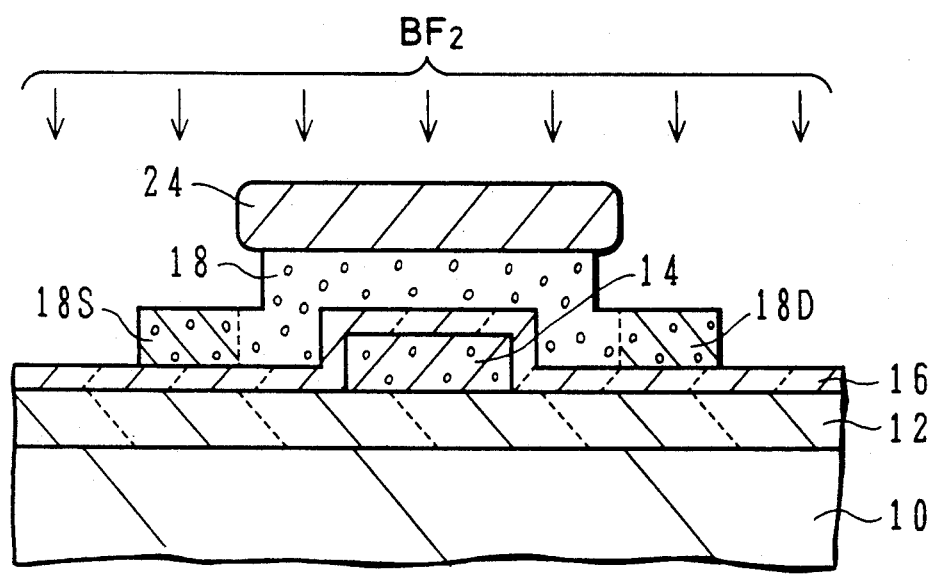
Figure 6:
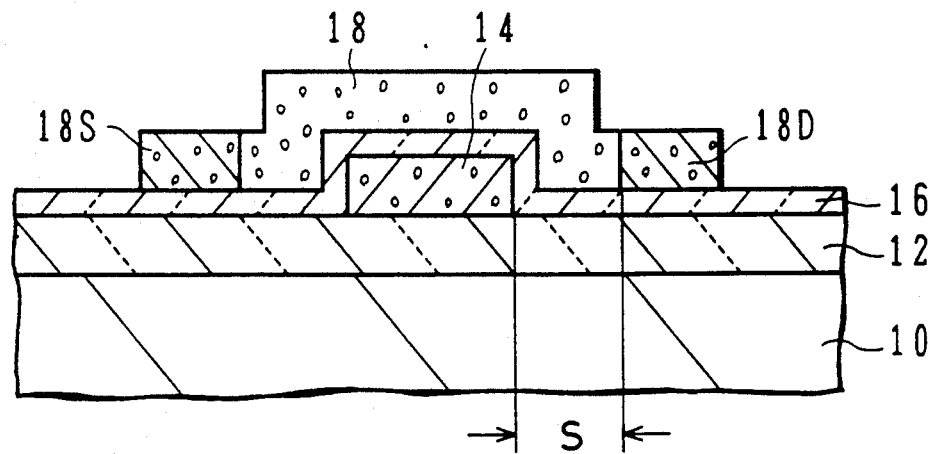

With the above-described method, the length L of the mask material layer 24 indicated in FIGS. 4 and 7 extending to the drain side can be precisely controlled through the selective growth of W or the like, thereby considerably reducing the variance of offset amounts S indicated in FIG. 6. Accordingly, lower gate type MOS thin film transistors having uniform characteristics can be manufactured.

In the process mechanism described above, mask material such as tungsten is isotopically grown only on the exposed surface of the silicon semiconductor layer which operates as growth nuclei, by using the reduction reaction of tungsten hexafluoride with silicon. In the above embodiment, gasses are chemically decomposed to deposit tungsten by CVD. A laser beam may be partially applied to chemically decompose gasses and deposit tungsten by CVD.

The length L of the mask material layer extending from the semiconductor layer allows to form source and drain regions in a self-alignment manner through ion injection or the like.

In the above embodiment, a mask material layer such as W is selectively grown with a side-projection on the semiconductor layer overlaying the gate electrode layer. Source and drain regions are formed by a selective ion injection process by using the mask material layer as the mask. Accordingly, the variance of the positions of source and drain regions can be reduced.

In the above description, although a lower gate type MOSTFT is formed on a semiconductor substrate, other insulating substrates such as quartz substrates may be used in place of the semiconductor substrate.

The present invention has been described in connection with the preferred embodiment. The invention is not intended to be limited to the embodiment only. It is obvious for those skilled in the art to make various modifications, changes, replacements, combinations, improvements, and the like, basing upon the above-described disclosure of the invention.

I claim:

1. A method of manufacturing an under-gated semiconductor device comprising the steps of:

forming a gate electrode layer on an insulating surface of a substrate;

forming a gate insulating film covering said gate electrode layer;

forming a semiconductor layer on said gate insulating film to overlie said gate electrode layer;

forming a flat coating film covering said semiconductor layer;

etching back said coating film to partially expose a surface of said semiconductor layer at an area overlying said gate electrode layer and to leave said coating film at two side areas of the exposed surface;

selectively growing a mask material layer on the exposed surface of said semiconductor layer with a side-projection, by using said left coating film as a mask; and removing said left coating film and selectively injecting impurity ions in said semiconductor layer to form an impurity doped source region and an impurity doped drain region at opposite sides of said gate electrode region, by using said mask material layer as an ion injection mask.

2. A method according to claim 1, wherein said mask material layer is made of tungsten.

3. A method according to claim 1, wherein the selective growth of said mask material layer is performed by chemical vapor deposition.

4. A method according to claim 3, wherein said chemical vapor deposition is performed by using a reduction reaction of tungsten hexafluoride with silicon.

5. A method according to claim 3, wherein said chemical vapor deposition is performed under an application of light.

6. A method according to claim 1, wherein said injected ions are BF$_2$ ions.

* * * * *